United States Patent
Hsu

(10) Patent No.: US 8,684,558 B2
(45) Date of Patent: Apr. 1, 2014

(54) LIGHT BAR STRUCTURE

(71) Applicant: Lextar Electronics Corporation, Hsinchu (TW)

(72) Inventor: Kai-Ksuan Hsu, Yilan (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/653,465

(22) Filed: Oct. 17, 2012

(65) Prior Publication Data

US 2013/0100668 A1 Apr. 25, 2013

(30) Foreign Application Priority Data

Oct. 21, 2011 (TW) .............................. 100138398 A

(51) Int. Cl.
*F21V 21/00* (2006.01)

(52) U.S. Cl.
USPC .................. 362/249.04; 362/217.01; 362/221; 362/249.01; 362/249.02; 362/418; 313/505

(58) Field of Classification Search
USPC .................. 362/217.01, 227, 249.01, 249.02, 362/249.04, 253, 382, 418, 800, 221, 225; 313/505
See application file for complete search history.

(56) References Cited

U.S. PATENT DOCUMENTS

2007/0097700 A1* 5/2007 Pederson ...................... 362/555
2011/0188248 A1 8/2011 Chang

FOREIGN PATENT DOCUMENTS

| TW | 201009450 A | 3/2010 |
|---|---|---|
| TW | M383680 | 7/2010 |
| TW | M390412 | 10/2010 |
| TW | M403959 | 5/2011 |
| TW | M408048 | 7/2011 |

OTHER PUBLICATIONS

English language translation of abstract of TW M390412 (published Oct. 11, 2010).
TW Office Action dated Dec. 6, 2013.
English Abstract translation of TWM403959 (Published May 21, 2011).
English Abstract translation of TWM408048 (Published Jul. 21, 2011).

* cited by examiner

*Primary Examiner* — Stephen F Husar
*Assistant Examiner* — Meghan Dunwiddie
(74) *Attorney, Agent, or Firm* — McClure, Qualey & Rodack, LLP

(57) ABSTRACT

A light bar structure including a base, a flexible circuit board (FCB), a first circuit, a second circuit, and a first connector is provided. The base has first and second surfaces. The FCB is on the first surface. The first circuit on the FCB includes N+1 serial first conductive contact pads, N light-emitting elements, and a first conductive wire. N≥1 and N is a positive integer. The second circuit on the FCB includes N+1 serial second conductive contact pads, and a second conductive wire. To form a closed loop, the first connector connects a first one of the first conductive contact pads and a first one of the second conductive contact pads and the second connector connects a (i+1)-th one of the first conductive contact pads and a (i+1)-th one of the second conductive contact pads. 1≤i≤N and i is a positive integer.

20 Claims, 5 Drawing Sheets

LIGHT BAR STRUCTURE

This application claims the benefit of Taiwan application Serial No. 100138398, filed Oct. 21, 2011, the subject matter of which is incorporated herein by reference.

TECHNICAL FIELD

The disclosure relates in general to a light bar structure, and more particularly to an easily-manufactured light bar structure.

BACKGROUND

Electric lighting brings about great convenience to people in their everydayness. Commonly used luminous devices, such as fluorescent lamps, tungsten bulbs, or energy-saving bulbs, have advantages of lower cost but are still disadvantaged by large power consumption, heat generation and short lifespan. Therefore, people pay attention on light-emitting diode (LED) lighting lamps.

As for manufacturing time for LED lighting lamps, due to the lengthy manufacturing process, the manufacturing time for LED lighting lamps may take up to 5~10 days, so that the manufacturers are unable to provide a large number of LED lighting lamps within a short period of time.

SUMMARY OF THE DISCLOSURE

The disclosure is directed to a light bar structure. Light-emitting diodes (LED) are disposed on a flexible circuit board (FCB), and a connector is used for fixing the FCB on a base and for electrically connecting the LEDs to a power supply.

According to an exemplary embodiment of the present disclosure, a light bar structure including a base, a flexible circuit board (FCB), a first circuit, a second circuit, and a first connector is provided. The base has first and second surfaces parallel and opposite to each other. The FCB is disposed on a first surface of the base. The first circuit is formed on the FCB, and includes N+1 sequentially-arranged first conductive contact pads, N light-emitting elements, and a first conductive wire used for connecting the light-emitting elements and the first conductive contact pads, wherein N≥1 and N is a positive integer. The second circuit is formed on the FCB, and includes N+1 sequentially-arranged second conductive contact pads, and a second conductive wire used for connecting the second conductive contact pads. The first connector is used for connecting a first one of the first conductive contact pads of the first circuit and a first one of the second conductive contact pads of the second circuit. The second connector is used for connecting an (i+1)-th one of the first conductive contact pads of the first circuit and an (i+1)-th one of the second conductive contact pads of the second circuit, so that the first and the second circuits and the first and the second connectors form a closed loop, wherein 1≤i≤N and i is a positive integer.

According to another exemplary embodiment of the present disclosure, a light bar structure including a base, a flexible circuit board (FCB), a light-emitting circuit, and a first connector is provided. The base has first and second surfaces parallel and opposite to each other. The flexible circuit board (FCB) is disposed on a first surface of the base. The light-emitting circuit is formed on the FCB, and includes M third circuits sequentially-arranged on the FCB, wherein M≥1, and M is a positive integer. Each third circuit includes: a first conductive contact pad, a second conductive contact pad, a light-emitting element and a conductive wire. The light-emitting element is disposed between the first and the second conductive contact pads. The conductive wire is used for serially connecting the first and the second conductive contact pads, the light-emitting elements and an adjacent third circuit. The first connector connects the first and the second conductive contact pads of the first one of the third circuits to form a closed loop.

The above and other contents of the disclosure will become better understood with regard to the following detailed description of the preferred but non-limiting embodiment(s). The following description is made with reference to the accompanying drawings.

DETAILED DESCRIPTION OF THE DISCLOSURE

First Embodiment

Figure 1:
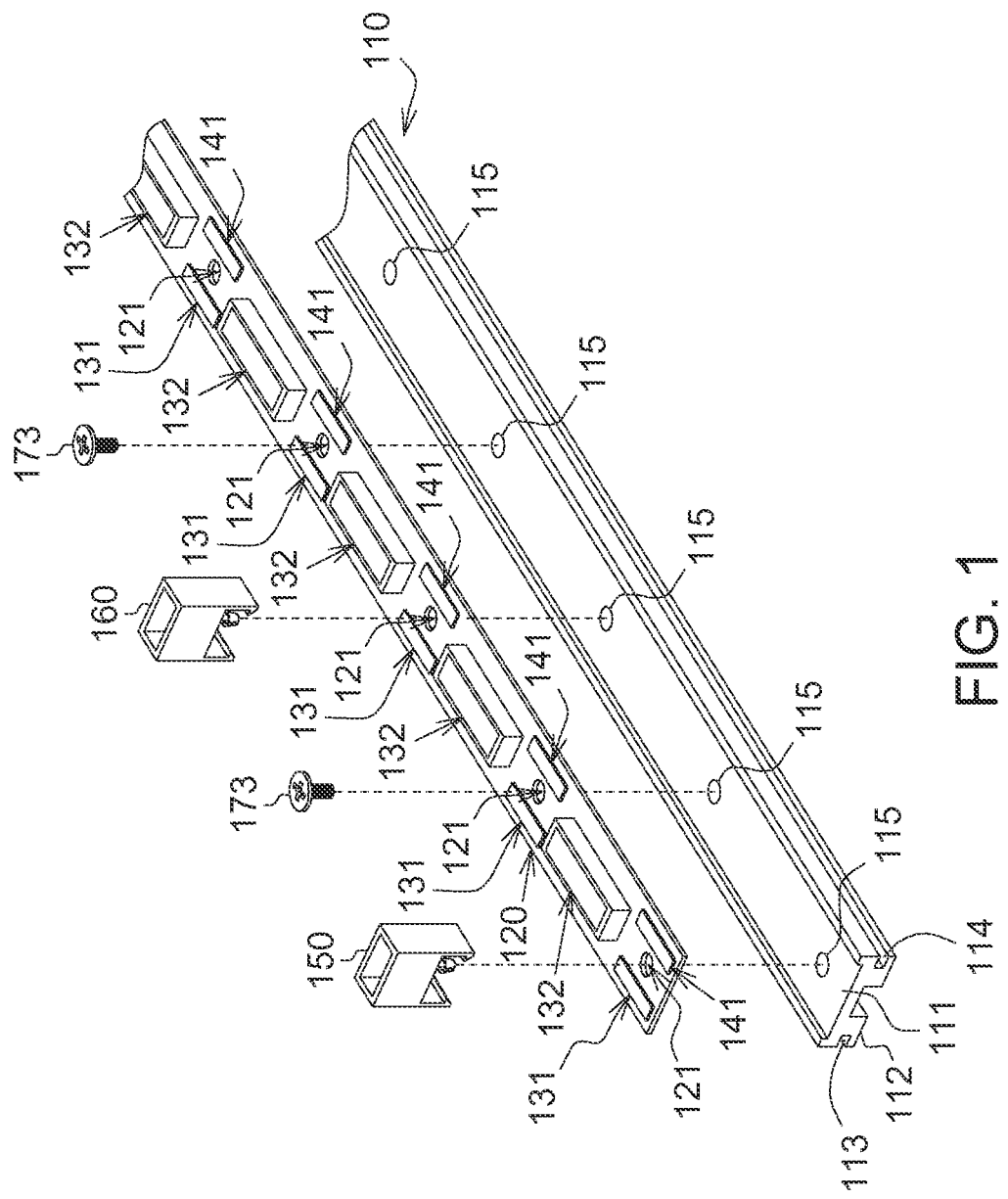
FIG. 1 shows an explosion diagram of a light bar structure according to a first embodiment of the disclosure.
Figure 2:
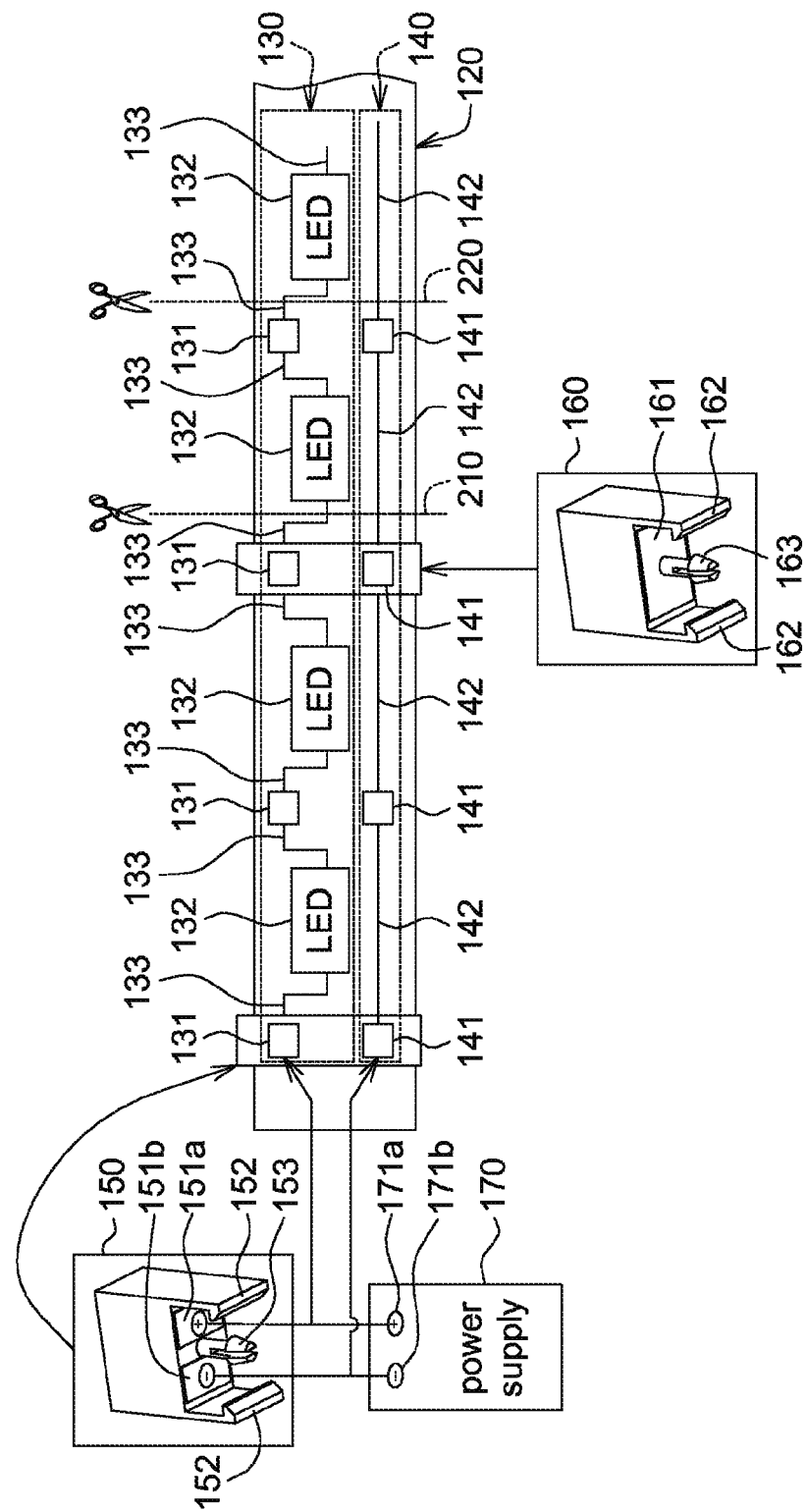
FIG. 2 shows a circuit diagram of the light bar structure according to the first embodiment of the disclosure.
Figure 3:
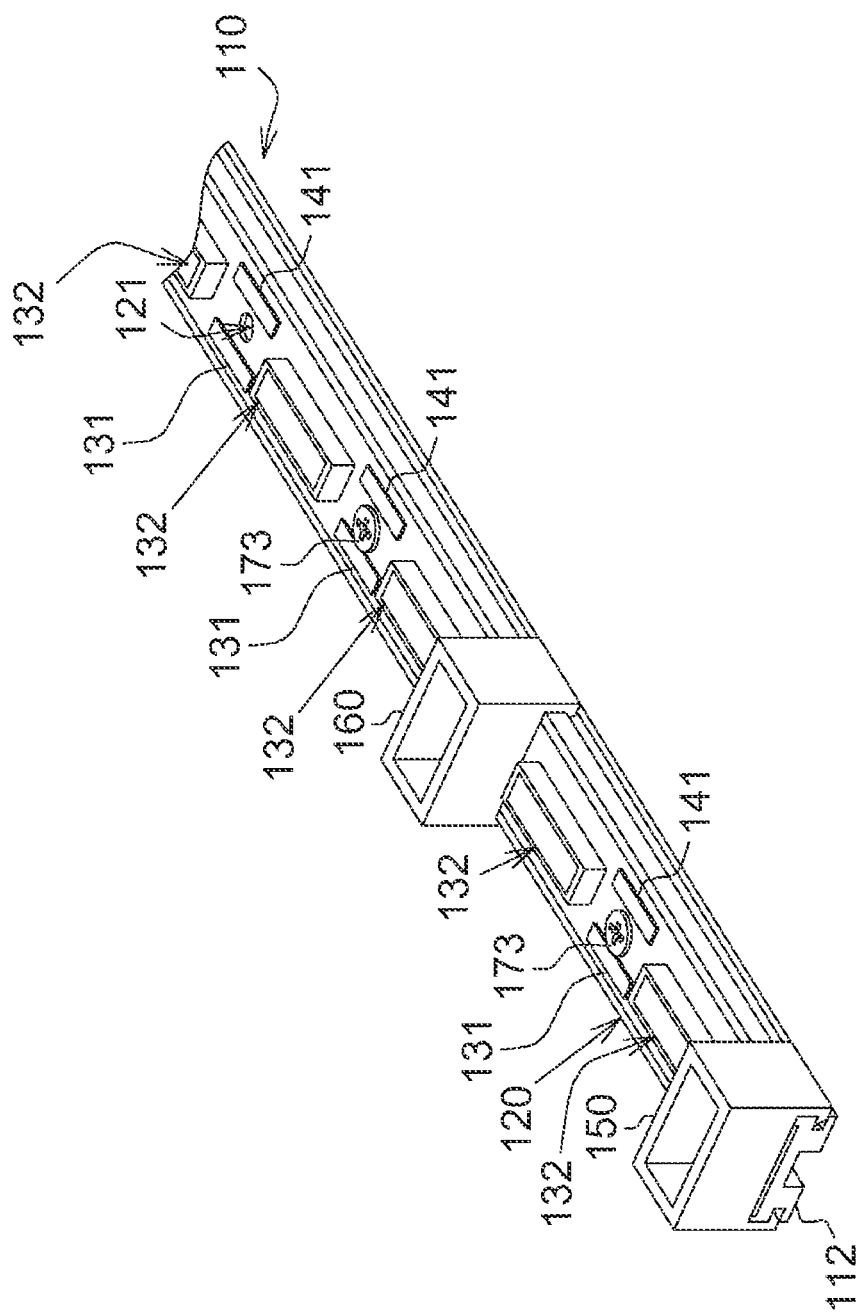
FIG. 3 shows an assembly diagram of the light bar structure according to the first embodiment of the disclosure.

Referring to FIGS. 1~3. FIG. 1 shows an explosion diagram of a light bar structure according to a first embodiment of the disclosure. FIG. 2 shows a circuit diagram of the light bar structure according to the first embodiment of the disclosure. FIG. 3 shows an assembly diagram of the light bar structure according to the first embodiment of the disclosure.

The light bar structure 100 includes: a base 110, a flexible circuit board (FCB) 120, a first circuit 130, a second circuit 140, a first connector 150 and a second connector 160.

The base 110 has a first surface 111 and a second surface 112 which are parallel and opposite to each other. A first slot 113 and a second slot 114, parallel to each other, are respectively disposed on edges of the second surface 112 of the base 110.

The first circuit 130 is formed on the FCB 120. The first circuit 130 includes N+1 sequentially-arranged first conductive contact pads 131, N light-emitting elements (such as but not limited to light-emitting diodes) 132, and a first conductive wire 133 used for connecting the light-emitting elements 132 and the first conductive contact pads 131, wherein N≥1 and N is a positive integer.

The second circuit 140 is formed on FCB 120. The second circuit 140 includes N+1 sequentially-arranged second conductive contact pads 141, and a second conductive wire 142 used for connecting the second conductive contact pads 141.

The first connector 150 connects a first one of the first conductive contact pads 131 of the first circuit 130 and a first one of the second conductive contact pads 141 of the second circuit 140. The second connector 160 connects an (i+1)-th one of the first conductive contact pads 131 of the first circuit 130 and an (i+1)-th one of the second conductive contact pads 141 of the second circuit 140, wherein 1≤i≤N and i is a positive integer. Thus, the first circuit 130, the second circuit 140, the first connector 150, the second connector 160, and the light-emitting elements 132 between the first connector 150 and the second connector 160 form an electric closed loop.

The first connector 150 is further electrically connected to the power supply 170 to drive the LEDs on the electric closed loop. The power supply 170 includes a first electrode 171a and a second electrode 171b, wherein the polarity of the first electrode 171a is opposite to that of the second electrode 171b.

The first connector 150 includes a first conductive piece 151a and a second conductive piece 151b. The first conductive piece 151a is electrically connected to a first one of the first conductive contact pads 131 of the first circuit 130 and the first electrode 171a of the power supply 170. The second conductive piece 151b is electrically connected to a first one of the second conductive contact pads 141 of the second circuit 140 and the second electrode 171b of the power supply 170. The first conductive piece 151a and the second conductive piece 151b are electrically isolated from each other. For example, each of the first conductive piece 151a and the second conductive piece 151b may be formed by a metal piece and the first conductive piece 151a and the second conductive piece 151b does not contact each other.

The second connector 160 includes a third conductive piece 161. The third conductive piece 161 is electrically connected to an (i+1)-th one of the first conductive contact pads 131 of the first circuit 130 and an (i+1)-th one of the second conductive contact pads 141 of the second circuit 140.

In the present embodiment, in clip of the light bar structure, the FCB 120 and the base 110 may be clipped according to actual needs to adjust the final length of the light bar structure. As indicated in FIG. 2, to obtain a light bar structure having 2 LEDs, the first connector 150 is electrically connected to a first one of the first conductive contact pads 131 and a first one of the second conductive contact pads 141, the second connector 160 is electrically connected to a third one of the first conductive contact pads 131 and a third one of the second conductive contact pads 141, and the FCB 120 is clipped along the dotted line 210. By so, manufacturing of the light bar structure having 2 LEDs is thus completed.

To obtain a light bar structure having 3 LEDs, the first connector 150 is electrically connected to a first one of the first conductive contact pads 131 and a first one of the second conductive contact pads 141, the second connector 160 is electrically connected to a fourth one of the first conductive contact pads 131 and a fourth one of the second conductive contact pads 141, and the FCB 120 is clipped along the dotted line 220. By so, manufacturing of the light bar structure having 3 LEDs is thus completed. However, the present embodiment is not limited thereto. The FCB 120 may also be clipped at other positions to obtain a light bar structure having a required number of LEDs.

Also, as indicated in FIG. 2, the first connector 150 has two hook portions 152 respectively corresponding to the first slot 113 and the second slot 114 on the base 110. The two hook portions 152 may also be engaged in the first slot 113 and the second slot 114 for fixing the first connector 150 on the FCB 120 and the base 110 as indicated in FIG. 3, so that the first conductive piece 151a and the second conductive piece 151b respectively contact the first conductive contact pad 131 and the second conductive contact pad 141.

The second connector 160 also has two hook portions 162 respectively corresponding to the first slot 113 and the second slot 114 on the base 110. The two hook portions 162 may be engaged in the first slot 113 and the second slot 114 for fixing the second connector 160 on the FCB 120 and the base 110 as indicated in FIG. 3, so that the third conductive piece 161 respectively contact the first conductive contact pad 131 and the second conductive contact pad 141.

Referring to FIG. 1 again. The FCB 120 further includes a plurality of first positioning holes 121, each between the first conductive contact pad 131 and the second conductive contact pad 132. The base 110 also includes a plurality of second positioning holes 115, wherein the position of each second positioning hole 115 corresponds to that of each first positioning hole 121.

The first connector 150 further includes a first positioning inserter 153 disposed between the first and the second conductive pieces as indicated in FIG. 2. The first positioning inserter 153 passes through one of the first positioning holes 121 of the FCB 120 and a corresponding one of the second positioning holes 115 of the base 110, for fixing the first connector 150 on the FCB 120 and the base 110 as indicated in FIG. 3, so that the first conductive piece 151a, the second conductive piece 151b respectively contact the first conductive contact pad 131 and the second conductive contact pad 141.

Likewise, the second connector 160 has a second positioning inserter 163 as indicated in FIG. 2. The second positioning inserter 163 passes through one of the first positioning holes 121 of the FCB 120 and a corresponding one of the second positioning holes 115 of the base 110, for fixing the second connector 160 on the FCB 120 and the base 110 as indicated in FIG. 3, so that the third conductive piece 161 contacts the first conductive contact pad 131 and the second conductive contact pad 141.

The light bar structure 100 may further include at least one third positioning inserter 173 passing through one of the first positioning holes 121 of the FCB 120 and a corresponding one of the second positioning holes 115. In the present embodiment, the first connector 150 and the second connector 160 are for fixing the FCB 120 on the base 110. However, if the first connector 150 and the second connector 160 are far away, for fixing the FCB 120 on the base 110 firmly, the third positioning inserter 173 such as a screw may be used in the present embodiment. The third positioning inserter 173 passes through other positioning holes 121 and 115 for even more firmly fixing the FCB 120 on the base 110. If more third positioning inserters 173 are used, the FCB 120 is even more firmly fixed on the base 110.

Figure 4:
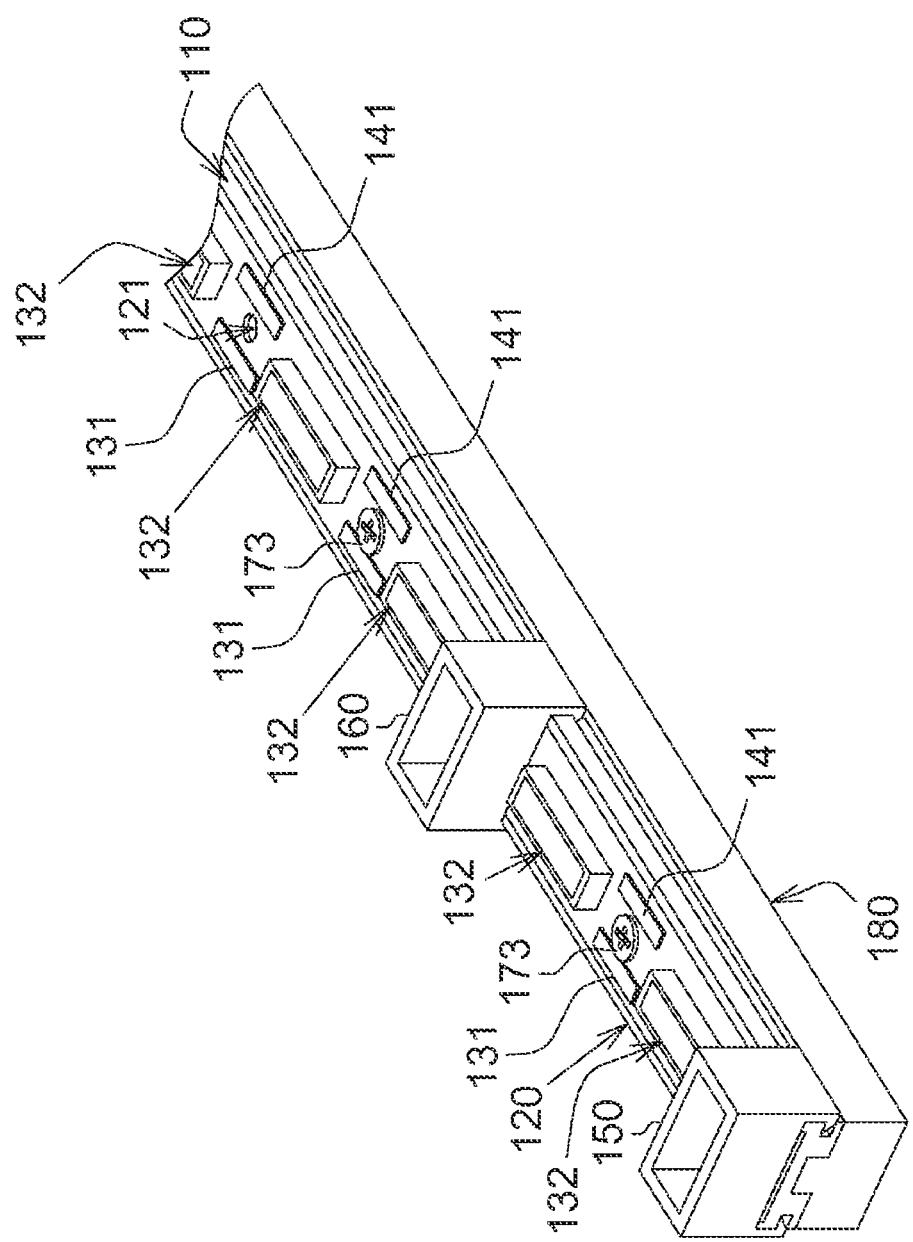
FIG. 4 shows an assembly diagram of another light bar structure containing a dissipation unit according to the first embodiment of the disclosure.

FIG. 4 shows an assembly diagram of another light bar structure containing a dissipation unit according to the first embodiment of the disclosure. Referring to FIG. 4, the light bar structure 100 may further include a dissipation unit 180 disposed under the base 110. The dissipation unit 180 is used for dissipating the light-emitting elements 132. The dissipation unit 180 may be fixed on the base 110 by many ways, and the present embodiment is not limited thereto. For example, the dissipation unit 180 may have a top protrusion portion, and the top protrusion portion may be engaged with the recess on the base 110 for fixing the dissipation unit 180 on the base 110.

Second Embodiment

Figure 5:
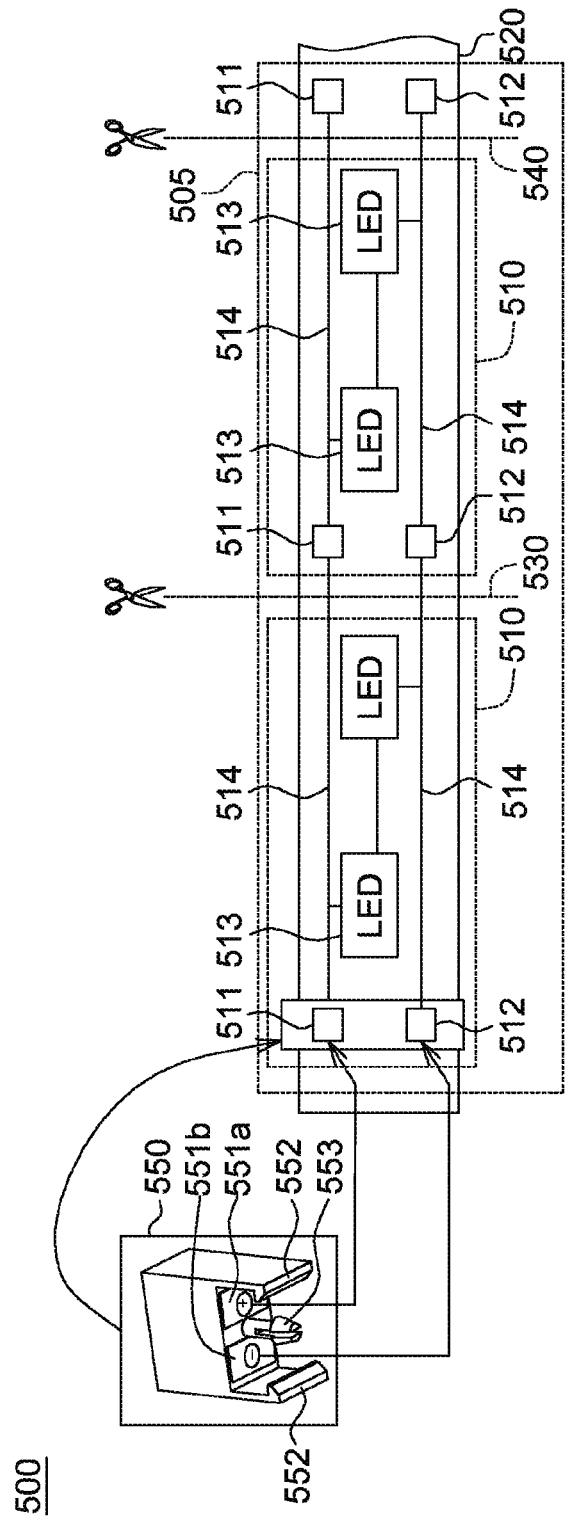
FIG. 5 shows a circuit diagram of a light bar structure according to a second embodiment of the disclosure.

Referring to FIG. 5, a circuit diagram of a light bar structure according to a second embodiment of the disclosure is shown. Basically, the base, the FCB and the first connector used in the second embodiment may be identical or similar to that used in the first embodiment.

Referring to FIG. 5. In the light bar structure 500 of the second embodiment of the disclosure, a light-emitting circuit 505 is formed on an FCB 520. The light-emitting circuit 505 includes M third circuits 510 sequentially-arranged on the FCB, wherein M≥1, and M is a positive integer. Each third circuit 510 includes: a first conductive contact pad 511, a second conductive contact pad 512, at least one light-emitting element 513 (such as but not limited to LED) disposed between the first and the second conductive contact pads 511 and 512, and a plurality of conductive wires 514. For convenience of elaboration, the present embodiment is exemplified by the arrangement that each third circuit 530 has two LEDs but is not limited thereto. The conductive wires 514 are used for connecting the first conductive contact pad 511, the second conductive contact pad 512, the light-emitting elements 513 and other adjacent third circuit 510.

The first connector 550 is used for connecting the first conductive contact pad 511 and the second conductive contact pad 512 of a first one of the third circuits 510. Therefore, the first connector 550, the first conductive contact pad 511, the second conductive contact pad 512, two LEDs 513 and the conductive wires 514 form an electric closed loop in the first one of the third circuits 510.

Likewise, the first connector 550 is further electrically connected to a power supply (not illustrated). The first connector 550 includes a first conductive piece 551a and a second conductive piece 551b. The first conductive piece 551a is electrically connected to the first conductive contact pad 511 of the first one of the third circuits 510 and a first electrode (not illustrated) of the power supply. The second conductive piece 551b is electrically connected to the second conductive contact pad 512 of the first one of the third circuits 510 and a second electrode (not illustrated) of the power supply. The first conductive piece 551a and the second conductive piece 551b are electrically isolated from each other.

Like the first embodiment, in the second embodiment, the first connector 550 has two hook portions 552 respectively corresponding to a first slot and a second slot on the base. The two hook portions 552 are engaged in the first and the second slots for positioning the first connector on the FCB and the base.

Like the first embodiment, in the second embodiment, the FCB 520 has a plurality of first positioning holes between the first and the second conductive contact pads, and the base has a plurality of second positioning holes, and the position of each first positioning hole corresponds to that of each second positioning hole.

The first connector 550 further includes a positioning inserter 553 between the first and the second conductive pieces 551a and 551b. The positioning inserter 553 passes through a first positioning hole on the FCB 520 and a second positioning hole on the base.

Like the first embodiment, in the second embodiment, the light bar structure may further include at least one screw. The screw passes through a first positioning hole and a second positioning hole opposite to the first positioning hole for even more firmly fixing the FCB 520 on the base. The light bar structure may further include a dissipation unit disposed under the base for dissipating heat off the light-emitting elements.

In the second embodiment, in clipping the light bar structure, the FCB and the base may be clipped according to actual needs to adjust the final length of the light bar structure. As indicated in FIG. 5, the first connector 550 is prepared and electrically connected to the first conductive contact pad 511 and the second conductive contact pad 512 of the first one of the third circuits 510. Then, a light bar structure having 2 LEDs is obtained by clipping the FCB along the dotted line 530. Likewise, another first connector 550 is prepared and electrically connected to the first conductive contact pad 511 and the second conductive contact pad 512 of a second one of the third circuits 510. Then, a light bar structure having 2 LEDs is obtained by clipping the FCB along the dotted line 540.

In the second embodiment, a first connector is used for forming an electric closed loop in the light bar structure. In the first embodiment, a first connector and a second connector are used for forming an electric closed loop in the light bar structure. In the circuit design of the second embodiment, if the number of LEDs for each the third circuit is the same, then a plurality of light bar structures having the same number of LEDs are obtained by clipping the FCB and the base as discussed above.

However, the above exemplification is merely an application of the second embodiment, and the third circuits may have different numbers of LEDs.

According to the above embodiments of the disclosure, a large number of light bar structures may be quickly manufactured within a short manufacturing time. Also, the light bar structures conforming to specific requirements in terms of length and brightness may be manufactured to fit actual needs. The larger the number of LEDs, the higher the brightness will be achieved. The light bar structure obtained according the above embodiments of the disclosure may be used in the lighting lamps and household illumination.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light bar structure, comprising:
a base having a first surface and a second surface parallel and opposite to each other;
a flexible circuit board (FCB) disposed on the first surface;
a first circuit disposed on the FCB, comprising N+1 sequentially-arranged first conductive contact pads, N light-emitting elements and a first conductive wire for connecting the light-emitting elements and the first conductive contact pads, wherein N≥1, and N is a positive integer;
a second circuit disposed on the FCB, comprising N+1 sequentially-arranged second conductive contact pads and a second conductive wire for connecting the second conductive contact pads; and
a first connector used for connecting a first one of the first conductive contact pads of the first circuit, a first one of the second conductive contact pads of the second circuit, and a second connector used for connecting an (i+1)-th one of the first conductive contact pads of the first circuit and an (i+1)-th one of the second conductive contact pads of the second circuit, so that the first and the second circuits, and the first and the second connectors form a closes loop, wherein 1≤i≤N, and i is a positive integer.

2. The light bar structure according to claim 1, wherein the first connector is further electrically connected to a power supply comprising a first electrode and a second electrode whose polarity is opposite to that of the first electrode.

3. The light bar structure according to claim 2, wherein the first connector comprises a first conductive piece and a second conductive piece, the first conductive piece is electrically connected to the first one of the first conductive contact pads of the first circuit and the first electrode of the power supply, the second conductive piece is electrically connected to the first one of the second conductive contact pads of the second circuit and the second electrode of the power supply, and the first conductive piece and the second conductive piece are electrically isolated from each other.

4. The light bar structure according to claim 3, wherein the second connector comprises a third conductive piece, the third conductive piece is electrically connected to the (i+1)-th one of the first conductive contact pads of the first circuit and the (i+1)-th one of the second conductive contact pads of the second circuit.

5. The light bar structure according to claim 1, wherein a first slot and a second slot are parallel to each other and formed on edges of the second surface of the base.

6. The light bar structure according to claim 5, wherein each of the first connector and the second connector has two hook portions which are respectively corresponding to the first and the second slots and engaged therein for fixing the first connector and the second connector on the FCB and the base.

7. The light bar structure according to claim 3, wherein the FCB further comprises a plurality of first positioning holes each between the first and the second conductive contact pads, the base includes a plurality of second positioning holes, and position of each second positioning hole corresponds to that of each first positioning hole.

8. The light bar structure according to claim 7, wherein the first connector further comprises a first positioning inserter disposed between the first and the second conductive pieces, the first positioning inserter passing through one of the first positioning holes and a corresponding one of the second positioning holes.

9. The light bar structure according to claim 7, wherein the second connector further has a second positioning inserter passing through one of the first positioning holes and a corresponding one of the second positioning holes.

10. The light bar structure according to claim 7, further comprising at least one third positioning inserter passing through one of the first positioning holes and a corresponding one of the second positioning holes.

11. The light bar structure according to claim 1, further comprising a dissipation unit disposed under the base.

12. A light bar structure, comprising:
   a base having a first surface and a second surface parallel and opposite to each other;
   a flexible circuit board (FCB) disposed on the first surface;
   a light-emitting circuit disposed on the FCB, comprising M third circuits sequentially-arranged on the FCB, wherein M≥1, M is a positive integer, and each third circuit comprises:
      a first conductive contact pad;
      a second conductive contact pad;
      a light-emitting element disposed between the first and the second conductive contact pads; and
      a conductive wire used for serially connecting the first and the second conductive contact pads, the light-emitting element and an adjacent third circuit; and
   a first connector used for connecting the first and the second conductive contact pads of a first one of the third circuits to form a closed loop.

13. The light bar structure according to claim 12, wherein the first connector is further electrically connected to a power supply comprising a first electrode and a second electrode whose polarity is opposite to that of the first electrode.

14. The light bar structure according to claim 13, wherein the first connector comprises a first conductive piece and a second conductive piece, the first conductive piece is electrically connected to the first conductive contact pads of the first one of the third circuit and the first electrode of the power supply, the second conductive piece is electrically connected to the second conductive contact pad of the first one of the third circuit and the second electrode of the power supply, and the first conductive piece and the second conductive piece are electrically isolated from each other.

15. The light bar structure according to claim 14, wherein a first slot and a second slot are parallel to each other and formed on edges of the second surface of the base.

16. The light bar structure according to claim 15, wherein the first connector has two hook portions respectively corresponding to the first and the second slots and are engaged therein for positioning the first connector on the FCB and the base.

17. The light bar structure according to claim 16, wherein the FCB has a plurality of first positioning holes, each disposed between the first and the second conductive contact pads, the base has a plurality of second positioning holes, and position of each first positioning hole corresponds to that of each second positioning hole.

18. The light bar structure according to claim 17, wherein the first connector further comprises a first positioning inserter disposed between the first and the second conductive pieces and used for passing through one of the first positioning holes and a corresponding one of the second positioning holes.

19. The light bar structure according to claim 17, further comprising at least one screw used for passing through one of the first positioning holes and a corresponding one of the second positioning holes.

20. The light bar structure according to claim 12, further comprising a dissipation unit disposed under the base.

* * * * *

UNITED STATES PATENT AND TRADEMARK OFFICE
CERTIFICATE OF CORRECTION

| | | |
|---|---|---|
| PATENT NO. | : 8,684,558 B2 | Page 1 of 1 |
| APPLICATION NO. | : 13/653465 | |
| DATED | : April 1, 2014 | |
| INVENTOR(S) | : Kai-Hsuan Hsu | |

It is certified that error appears in the above-identified patent and that said Letters Patent is hereby corrected as shown below:

On the title page, item (76) name of inventor, replace "Kai-Ksuan Hsu" with "Kai-Hsuan Hsu"

Signed and Sealed this
Fifth Day of August, 2014

Michelle K. Lee
*Deputy Director of the United States Patent and Trademark Office*